(12) United States Patent
Yang et al.

(10) Patent No.: US 10,356,878 B1
(45) Date of Patent: Jul. 16, 2019

(54) DRIVER CIRCUIT FOR DRIVING LIGHT EMITTING DEVICE

(71) Applicant: RICHTEK TECHNOLOGY CORPORATION, Zhubei, Hsinchu (TW)

(72) Inventors: Huan-Chien Yang, New Taipei (TW); Tsung-Wei Huang, Taipei (TW); Hui-Wen Cheng, Taichung (TW); Shui-Mu Lin, Taichung (TW)

(73) Assignee: RICHTEK TECHNOLOGY CORPORATION, Zhubei, Hsinchu (TW)

( * ) Notice: Subject to any disclaimer, the term of this patent is extended or adjusted under 35 U.S.C. 154(b) by 0 days.

(21) Appl. No.: 16/198,860

(22) Filed: Nov. 22, 2018

Related U.S. Application Data

(60) Provisional application No. 62/627,109, filed on Feb. 6, 2018.

(30) Foreign Application Priority Data

Jul. 9, 2018 (TW) .............................. 107123631 A

(51) Int. Cl.
*G11C 27/02* (2006.01)
*H05B 37/02* (2006.01)

(52) U.S. Cl.
CPC ......... *H05B 37/0209* (2013.01); *G11C 27/02* (2013.01)

(58) Field of Classification Search
CPC .............................. H05B 37/0209; G11C 27/02

USPC ......................................................... 315/307
See application file for complete search history.

(56) References Cited

U.S. PATENT DOCUMENTS

| | | | | |
|---|---|---|---|---|
| 5,852,770 | A * | 12/1998 | Kasamatsu | H03G 3/3047 455/126 |
| 2004/0119451 | A1* | 6/2004 | Otake | H02J 1/04 323/274 |
| 2009/0284178 | A1* | 11/2009 | Jessenig | H02M 3/156 315/297 |
| 2010/0033150 | A1* | 2/2010 | Irissou | H02M 3/158 323/284 |
| 2012/0206058 | A1* | 8/2012 | Hirano | H05B 33/0818 315/245 |
| 2013/0169182 | A1* | 7/2013 | Park | H02M 3/33507 315/219 |

(Continued)

*Primary Examiner* — Don P Le
(74) *Attorney, Agent, or Firm* — Tung & Associates

(57) ABSTRACT

A light emitting device driver circuit includes: a power conversion circuit, an error amplifier circuit, a sample-and-hold circuit, a load current generation circuit and a feed-forward capacitor. When the light emitting device driver circuit is in a disable phase, the sample-and-hold circuit connects a feedback signal with a second reference voltage and the sample-and-hold circuit disconnects the feedback signal from a load node, whereby the feed-forward capacitor samples a sample voltage and holds it after the disable phase transits to an enable phase. In the enable phase, the sample-and-hold circuit disconnects the feedback signal from the second reference voltage and the sample-and-hold circuit connects the feedback signal with the load node, so that during a predetermined period following the transition, there is a sufficient difference between two input terminals of the error amplifier circuit so that the load current is raised to a desired current level within the predetermined period.

13 Claims, 7 Drawing Sheets

(56) References Cited

U.S. PATENT DOCUMENTS

2013/0257279 A1* 10/2013 Le ...................... H05B 33/0812
                                                      315/113
2016/0006358 A1*  1/2016 Chen ................. H02M 3/33507
                                                     363/21.16
2018/0180978 A1*  6/2018 Yamada ............. H05B 33/0815

* cited by examiner

DRIVER CIRCUIT FOR DRIVING LIGHT EMITTING DEVICE

CROSS REFERENCE

The present invention claims priority to U.S. 62/627,109, filed on Feb. 6, 2018, and TW 107123631, filed on Jul. 9, 2018.

BACKGROUND OF THE INVENTION

Field of Invention

The present invention relates to a driver circuit for driving light emitting device (light emitting device driver circuit). In particular, the present invention relates to such a light emitting device driver circuit having improved load-transient response by means of a sample-and-hold circuit, so that a load current can be fast raised up to a desired current level within a predetermined current elevation period.

Description of Related Art

Please refer to FIG. 1 and FIG. 2. FIG. 1 shows a schematic view of a prior art light emitting device driver circuit. FIG. 2 shows waveforms of operation signals of the prior art light emitting device driver circuit.

When the prior art light emitting device driver circuit 100 operates under a disable phase (i.e., when an enable signal EN is at its low level), the level of the load current iLOAD is zero, and the feedback signal FB is at a very high level (such as 1.6V), whereby a corresponding error amplification signal COMP is zero. In this prior art, because the reference voltage VREF is set to be a very low level (such as 0.2V), when the light emitting device driver circuit 100 transits from a disable phase to an enable phase (i.e., when the enable signal EN transits from a low level to a high level) at a transition time point Ts (as shown in FIG. 2), the feedback signal FB needs to fall down from its previous high level (for example but not limited to 1.6V) to a very low level (for example but not limited to 0.2V); hence, during a period T1 following the transition time point Ts, the output of the error amplifier circuit 13 remains at its previous state and does not transit its state. In other words, the error amplification signal COMP corresponding to the feedback signal FB still remains zero. As a consequence, the power conversion circuit 12 is unable to convert the input voltage VIN to the load current iLOAD. As shown in FIG. 2, during the period T1, the load current iLOAD is not raised up to a desired current level Ip. This is a significant drawback for the prior art. Referring to the waveform of the load current iLOAD during the period T1 in FIG. 2, in the period T1, the load current iLOAD can only drain current from the capacitor C2, so the current increases very slowly.

In addition, in this prior art, because the level of the load current iLOAD is related to the level of the feedback signal FB, this prior art has another drawback: when the feedback signal FB falls down to a level lower than the reference voltage VREF (for example but not limited to 0.2V), an undesirable overshoot effect may cause the feedback signal FB to become lower than for example but not limited to 0.1V. Because the level of the load current iLOAD is related to the level of the feedback signal FB, the feedback signal FB having an extremely low level will cause the load current iLOAD not to be able to be raised up to the desired current level Ip within a desired short period. The desired current level Ip is a load current level corresponding to the feedback signal FB having a value of 0.2V.

In view of the above, to overcome the drawbacks in the prior art, the present invention provides a light emitting device driver circuit, which is capable of improving the load-transient response by means of a sample-and-hold circuit, so that the load current fast raised up to a desired current level within a predetermined current elevation period.

SUMMARY OF THE INVENTION

From one perspective, the present invention provides a light emitting device driver circuit, which is configured to operably supply a load current to a light emitting device so as to drive the light emitting device; the light emitting device driver circuit comprising: a power conversion circuit, which is configured to operably convert an input voltage to an output voltage at an output terminal according to an error amplification signal and supply the load current to the light emitting device, wherein the light emitting device is coupled between the output terminal and a load node; an error amplifier circuit, which is configured to operably generate the error amplification signal according to a difference between a first reference voltage and a feedback signal; a sample-and-hold circuit, which is coupled between a terminal of the error amplifier circuit which receives the feedback signal and the load node; a load current generation circuit, wherein the load current generation circuit, the sample-and-hold circuit and the light emitting device are commonly coupled to the load node, the load current generation circuit being configured to operably determine a first current level of the load current during an enable phase and the load current generation circuit being configured to operably determine a second current level of the load current during a disable phase; and a feed-forward capacitor, which is coupled between the output terminal and the terminal of the error amplifier circuit which receives the feedback signal; wherein, when the light emitting device driver circuit operates in the disable phase, the sample-and-hold circuit connects the feedback signal with a second reference voltage, whereas the sample-and-hold circuit disconnects the feedback signal from the load node, whereby at a transition time point when a transition takes place from the disable phase to the enable phase, the feed-forward capacitor samples a sample voltage; wherein, when the light emitting device driver circuit operates in the enable phase, the sample-and-hold circuit disconnects the feedback signal from the second reference voltage, whereas the sample-and-hold circuit connects the feedback signal with the load node, whereby the feed-forward capacitor holds the sample voltage, so that during a predetermined current elevation period following the transition time point, there is a difference between the first reference voltage and the feedback signal, and the difference is large enough to cause the load current to be raised to the first current level within the predetermined current elevation period.

In one embodiment, a level of the second reference voltage is smaller than a level of the first reference voltage.

In one embodiment, a level of the second reference voltage is equal to a level of the first reference voltage.

In one embodiment, in the enable phase, the load current generation circuit determines the first current level according to a voltage of the load node.

In one embodiment, the first current level is related to the first reference voltage.

In one embodiment, the load current generation circuit includes a voltage-controlled current source, which is configured to operably regulate the load current according to the voltage of the load node.

In one embodiment, the sample-and-hold circuit includes: a resistor; a first switch, which is coupled in series to the resistor between the load node and the feedback signal; and a second switch, which is coupled between the feedback signal and the second reference voltage; wherein, when the light emitting device driver circuit operates in the disable phase, the first switch is controlled to be non-conductive, whereas the second switch is controlled to be conductive, whereby the feedback signal is electrically connected with the second reference voltage and the feedback signal is disconnected from the load node; and wherein, when the light emitting device driver circuit operates in the enable phase, the first switch is controlled to be conductive, whereas the second switch is controlled to be non-conductive, whereby the feedback signal is disconnected from the second reference voltage and the feedback signal is electrically connected with the load node.

In one embodiment, when the light emitting device driver circuit operates in the enable phase, the feed-forward capacitor provides a feed-forward function, whereby the light emitting device driver circuit operates under a steady state and a bandwidth of the light emitting device driver circuit is higher than a predetermined bandwidth.

In one embodiment, the predetermined current elevation period is related to a product of a resistance of the resistor multiplied by a capacitance of the feed-forward capacitor.

In one embodiment, the predetermined current elevation period is smaller than one microsecond (1 μs).

In one embodiment, the power conversion circuit includes a low dropout regulator or a switching regulator.

In one embodiment, the second current level is zero.

In one embodiment, the difference between the first reference voltage and the feedback signal during the predetermined current elevation period is smaller than a predetermined voltage difference.

The objectives, technical details, features, and effects of the present invention will be better understood with regard to the detailed description of the embodiments below.

DESCRIPTION OF THE PREFERRED EMBODIMENTS

The drawings as referred to throughout the description of the present invention are for illustration only, to show the interrelations between the circuits and/or between the signals, but not drawn according to actual scale of circuit sizes and signal amplitudes and frequencies.

Figure 1:
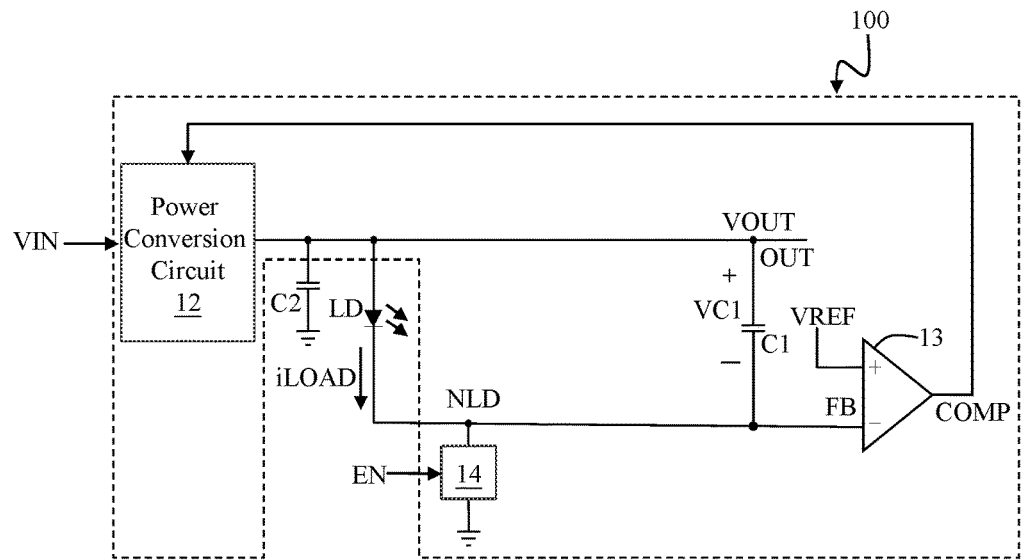
FIG. 1 shows a schematic view of a prior art light emitting device driver circuit.
Figure 2:
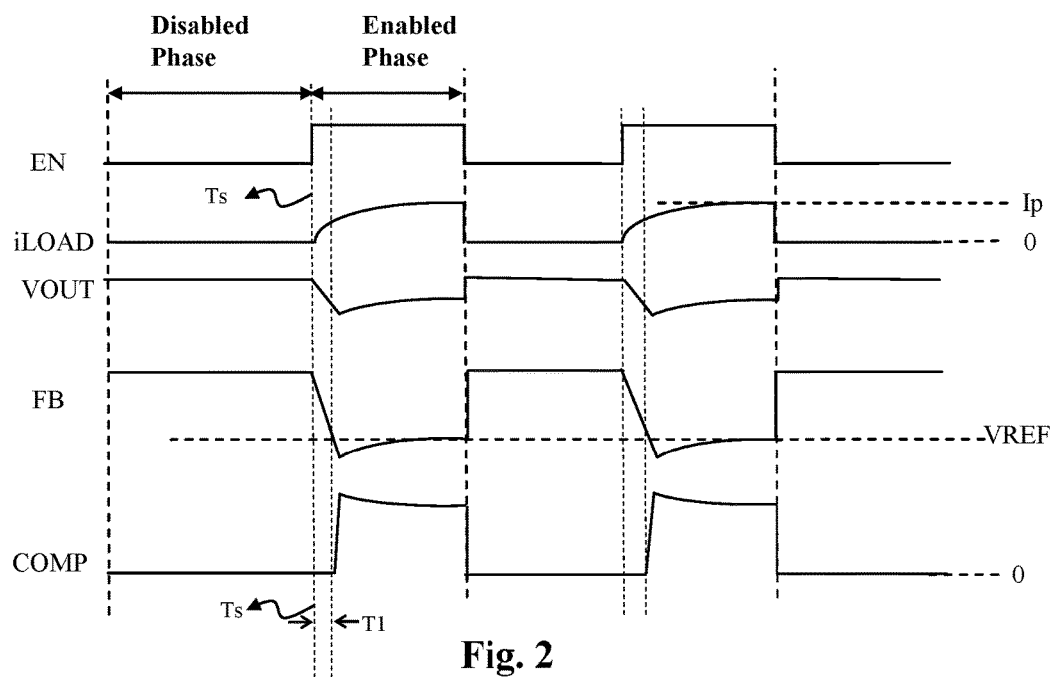
FIG. 2 shows waveforms of operation signals of the prior art light emitting device driver circuit.
Figure 3:
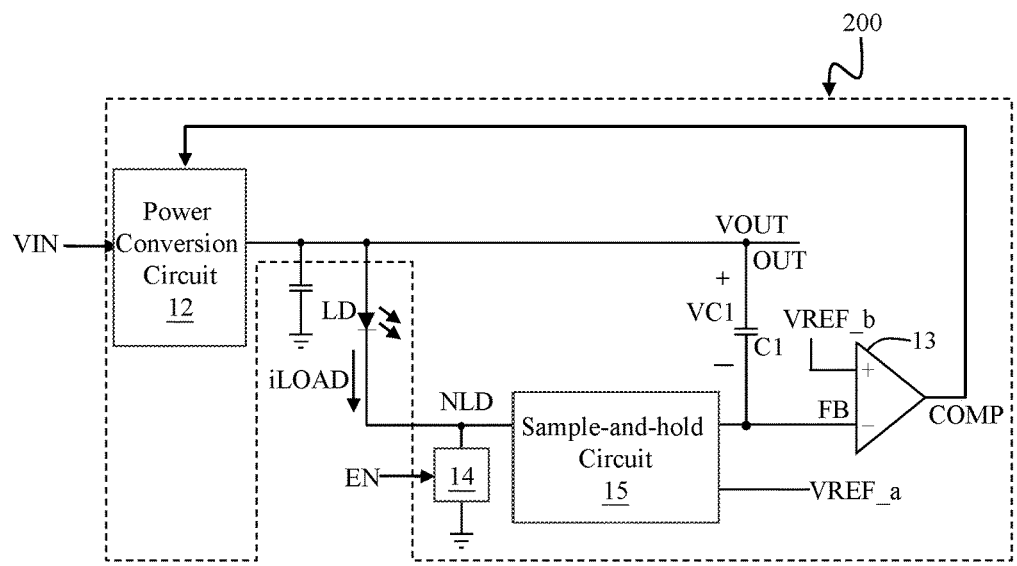
FIG. 3 shows a block diagram of a light emitting device driver circuit according to an embodiment of the present invention.
Figure 4:
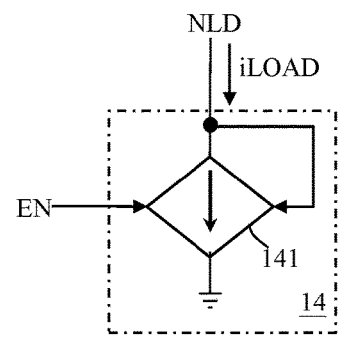
FIG. 4 shows an embodiment of a load current generation circuit according to the present invention.

Please refer to FIG. 3 and FIG. 4. FIG. 3 shows a block diagram of a light emitting device driver circuit according to an embodiment of the present invention. FIG. 4 shows an embodiment of a load current generation circuit according to the present invention.

As shown in FIG. 3, the light emitting device driver circuit 200 of the present invention is configured to operably supply a load current iLOAD to a light emitting device LD, so as to drive the light emitting device LD to emit light. The light emitting device LD for example can be, but not limited to, a laser light emitting diode. Such type of high power light emitting device requires a high driving current, and therefore generally, a pulse current is adopted to drive such type of light emitting device to avoid overheat. For this reason, it is required for the light emitting device driver circuit 200 of the present invention to rapidly raise the load current iLOAD to the desired current level (for example but not limited to 6A) during a short predetermined current elevation period (for example but not limited to 1 μs, one microsecond).

As shown in FIG. 3, in one embodiment, the light emitting device driver circuit 200 of the present invention includes: a power conversion circuit 12, an error amplifier circuit 13, a sample-and-hold circuit 15, a load current generation circuit 14 and a feed-forward capacitor C1.

In one embodiment, the power conversion circuit 12 is configured to operably convert an input voltage VIN to an output voltage VOUT at an output terminal OUT according to an error amplification signal COMP and supply the load current iLOAD to the light emitting device LD. As shown in FIG. 3, the light emitting device LD is coupled between the output terminal VOUT and a load node NLD. In one embodiment, a current input terminal of the light emitting device LD is coupled to the output voltage VOUT and a current output terminal of the light emitting device LD is coupled to the load node NLD.

Figure 9A:
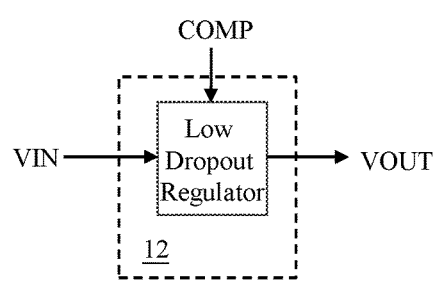
FIG. 9A shows an embodiment of a power conversion circuit according to the present invention.
Figure 9B:
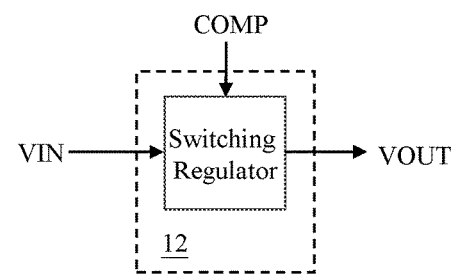
FIG. 9B shows another embodiment of a power conversion circuit according to the present invention.

In one embodiment, as shown in FIG. 9A, the power conversion circuit 12 can be, for example but not limited to, a low dropout regulator (LDO), which is configured to operably convert an input voltage VIN to an output voltage VOUT at an output terminal OUT according to the error amplification signal COMP by linear power conversion and supply the load current iLOAD to the light emitting device LD. In another embodiment, as shown in FIG. 9B, the power conversion circuit 12 can be, for example but not limited to, a switching regulator, which is configured to operably convert an input voltage VIN to an output voltage VOUT at an output terminal OUT according to the error amplification signal COMP by switching power conversion and supply the load current iLOAD to the light emitting device LD.

Please still refer to FIG. 3. The error amplifier circuit 13 is configured to operably generate the error amplification signal COMP according to a difference between a first reference voltage VREF_b and a feedback signal FB. In one embodiment, the error amplification signal COMP can be represented as the following equation:

the error amplification signal COMP=α*(first reference voltage VREF_b−the feedback signal FB), wherein α denotes an amplification ratio of the error amplifier circuit 13. Note that, the arrangement of the positive and negative input terminals of the error amplifier circuit 13 shown in FIG. 3 is only an illustrative example; the positive and negative input terminals of the error amplifier circuit 13 are interchangeable, so are the polarities of the error amplification signal COMP, with corresponding amendments of the circuits processing this signal.

The sample-and-hold circuit 15 is coupled between the terminal of the error amplifier circuit 13 which receives the feedback signal FB and the load node NLD. The details and the features as to how the present invention improves the load-transient response of the light emitting device driver circuits 200 and 300 by the sample-and-hold circuit 15, so that a load current iLOAD can be rapidly raised to a desired current level during the predetermined current elevation period will be described later.

The feed-forward capacitor C1 is coupled between the output terminal OUT and the terminal of the error amplifier circuit 13 which receives the feedback signal FB. As shown in FIG. 3, the voltage level across the feed-forward capacitor C1 is equal to VC1.

The load current generation circuit 14, the sample-and-hold circuit 15 and the light emitting device LD are commonly coupled to the load node NLD. The load current generation circuit 14 is configured to operably determine a first current level Ip of the load current iLOAD during an enable phase (referring to the enable signal EN shown in FIG. 3 and the waveform of the enable signal EN shown in FIG. 6), and determine a second current level of the load current iLOAD during a disable phase (referring to the enable signal EN shown in FIG. 3 and the waveform of the enable signal EN shown in FIG. 6) In one embodiment, the first current level Ip can be, for example but not limited to, the above-mentioned value of 6A and the second current level can be, for example but not limited to, zero as shown in FIG. 6.

In one embodiment, the load current generation circuit 14 determines the first current level Ip according to a voltage of the load node NLD. In one embodiment, the first current level Ip is related to the first reference voltage VREF_b. For example, as shown in FIG. 3 and FIG. 4, in one embodiment, the first reference voltage VREF_b is set to be 0.2V, and when a level of the feedback signal FB (i.e., a voltage level of the load node NLD) is approximately equal to 0.2V under a steady state of an enable phase, the first current level Ip is equal to 6A, that is, the first current level Ip being equal to 6A corresponds to the feedback signal FB being equal to the first reference voltage VREF_b.

Please refer to FIG. 4. In one embodiment, the load current generation circuit 14 can include, for example but not limited to, a voltage-controlled current source 141. As shown in FIG. 4, the voltage-controlled current source 141 is configured to operably regulate the load current iLOAD according to the voltage of the load node NLD. In one embodiment, the load current iLOAD can be, for example but not limited to, positively correlated with a voltage level of the load node NLD (which is substantially equal to a level of the feedback signal FB under an enable phase).

Figure 5A:
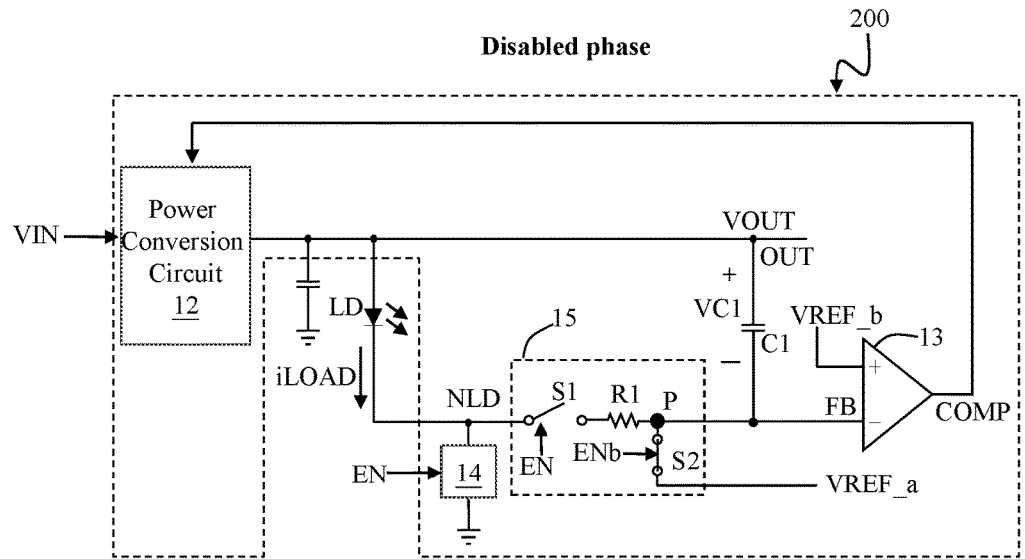
FIG. 5A shows a specific embodiment of a light emitting device driver circuit according to the present invention under a disable phase.
Figure 5B:
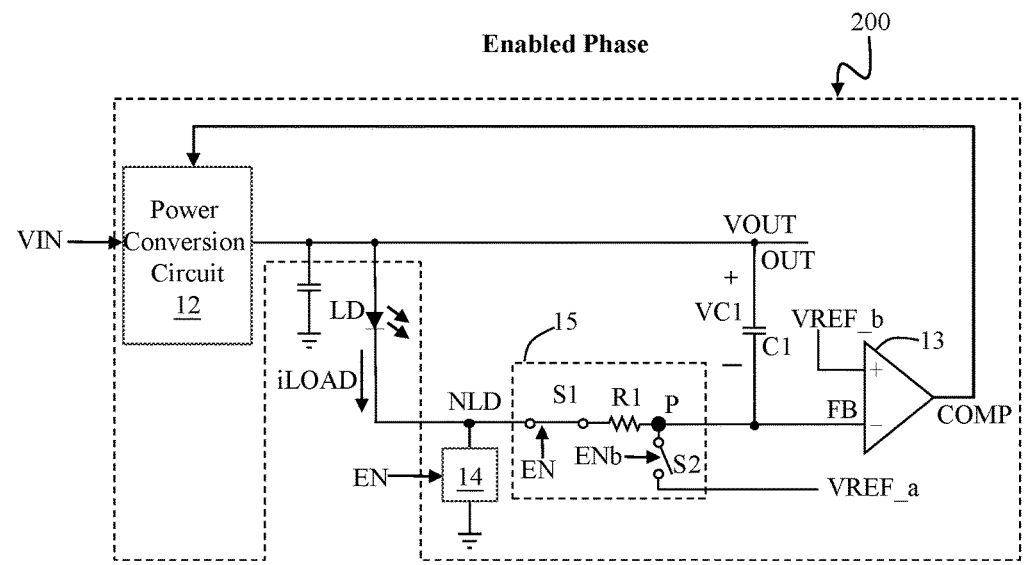
FIG. 5B shows a specific embodiment of a light emitting device driver circuit according to the present invention under an enable phase.
Figure 6:
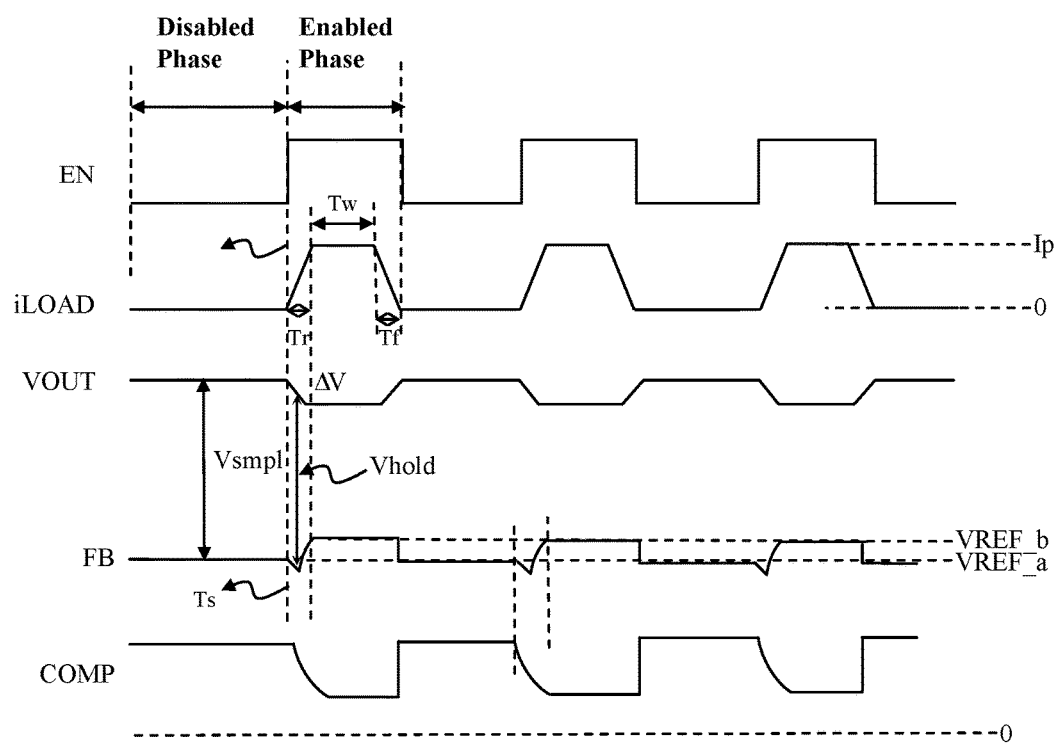
FIG. 6, corresponding to FIGS. 5A-5B, shows waveforms of operation signals of a light emitting device driver circuit according to the present invention.

Please refer to FIG. 5A, FIG. 5B and FIG. 6. FIG. 5A shows a specific embodiment of a light emitting device driver circuit according to the present invention under a disable phase. FIG. 5B shows a specific embodiment of a light emitting device driver circuit according to the present invention under an enable phase. FIG. 6, corresponding to FIGS. 5A-5B, shows waveforms of operation signals of a light emitting device driver circuit according to the present invention.

As shown in FIG. 5A and FIG. 5B, in one embodiment, the sample-and-hold circuit 15 can include, for example but not limited to: a resistor R1, a first switch S1 and a second switch S2. The first switch S1 is connected in series to the resistor R1 between the load node NLD and the terminal of the error amplifier circuit 13 which receives the feedback signal FB. The second switch S2 is coupled between the terminal of the error amplifier circuit 13 which receives the feedback signal FB and a second reference voltage VREF_a. Note that the serial connection of the first switch S1 and the resistor R1 can be of a different order; FIG. 5A and FIG. 5B only show one embodiment.

The following description will explain the details and the features as to how the present invention improves the load-transient response of the light emitting device driver circuit 200 by the sample-and-hold circuit 15, so that the load current iLOAD is rapidly raised to a desired current level during the predetermined current elevation period.

As shown in FIG. 5A, in one embodiment, when the light emitting device driver circuit 200 operates in the disable phase, the first switch S1 is controlled by the enable signal EN to be non-conductive, whereas the second switch S2 is controlled by, for example but not limited to, a complementary enable signal ENb and is controlled to be conductive, whereby the feedback signal FB is electrically connected with a second reference voltage VREF_a by the sample-and-hold circuit 15, whereas the feedback signal FB is disconnected from the load node NLD by the sample-and-hold circuit 15. Accordingly, at a transition time point Ts where a transition takes place from the disable phase to the enable phase (referring to the waveform of the enable signal EN as shown in FIG. 6), the feed-forward capacitor C1 samples and stores a sample voltage Vsmp1 (referring to the waveforms of the output voltage VOUT and the feedback signal FB as shown in FIG. 6). Note that "sample voltage Vsmp1" refers to a voltage level VC1 across the feed-forward capacitor C1 in the disable phase.

As shown in FIG. 5B, in one embodiment, when the light emitting device driver circuit 200 operates in the enable phase, the first switch S1 is controlled by the enable signal EN to be conductive, whereas the second switch S2 is controlled by the complementary enable signal ENb to be non-conductive, whereby the feedback signal FB is disconnected from the second reference voltage VREF_a by the sample-and-hold circuit 15, whereas the feedback signal FB is electrically connected with the load node NLD by the sample-and-hold circuit 15.

Accordingly, when the light emitting device driver circuit 200 operates in the enable phase, the feed-forward capacitor C1 holds the sample voltage Vsmp1 (as shown in FIG. 6, Vhold is approximately equal to Vsmp1), so that during a predetermined current elevation period Tr following the transition time point Ts (referring to the waveform of the feedback signal FB as shown in FIG. 6), there is a large difference between the first reference voltage VREF_b and the feedback signal FB, and thus the load current iLOAD can be rapidly raised to the first current level Ip during the predetermined current elevation period Tr.

In one embodiment, when the light emitting device driver circuit 200 operates in the enable phase, the feed-forward capacitor C1 provides a feed-forward effect for loop compensation and bandwidth adjustment, such that the light emitting device driver circuit 200 can operate under a steady state, and that the light emitting device driver circuit 200 can operate in a high frequency. It is noteworthy that, in this embodiment, the feed-forward capacitor C1 provides the function of feed-forward and also the function of sample-and-hold, to ensure loop stability, better bandwidth and current elevation speed, but without increasing the cost.

In one embodiment, the product of the resistance of the resistor R1 multiplied by the capacitance of the feed-forward capacitor C1 determines a time constant of the load-transient response of the light emitting device driver circuit 200. The predetermined current elevation period Tr is related to this time constant. In other words, the predetermined current elevation period Tr is related to the product of the resistance of the resistor R1 multiplied by the capacitance of the feed-forward capacitor C1.

In one embodiment, the predetermined current elevation period Tr can be, for example but not limited to, smaller than 1 μs (one microsecond). In the present invention, because the predetermined current elevation period Tr is very small, when the present invention and prior art operate under a same enable signal EN (i.e., in the same pulse width of the enable signal EN) the pulse width Tw (referring to FIGS. 6 and 8) of the load current iLOAD of the present invention is relatively wider than that of the load current of the prior art. In other words, the light emitting device driver circuit of the present invention can effectively increase the light intensity or the performance of other parameters of the light emitting device LD.

In addition, in this embodiment, when the light emitting device driver circuit 200 operates in the enable phase (i.e., when the enable signal EN is at its high level), the sample-and-hold circuit 15 disconnects the feedback signal FB from the second reference voltage VREF_a; therefore, during the predetermined current elevation period Tr, the level of the feedback signal FB increases from slightly lower than the second reference voltage VREF_a to the first reference voltage VREF_b by feedback control. That is, in one embodiment, when the light emitting device driver circuit 200 operates in the enable phase and when it becomes stable, the level of the feedback signal FB is approximately equal to the first reference voltage VREF_b.

In the embodiment of FIG. 6, the level of the second reference voltage VREF_a is smaller than the level of the first reference voltage VREF_b. However, the present invention is not limited to the embodiment shown in FIG. 6; it is also practicable and within the scope of the present invention if level of the second reference voltage VREF_a is equal to or slightly greater than the level of the first reference voltage VREF_b. An embodiment wherein the level of the second reference voltage VREF_a is equal to the level of the first reference voltage VREF_b will be described later.

In this embodiment, when the light emitting device driver circuit 200 operates in the enable phase (i.e., when the enable signal EN is at its high level), because the load current iLOAD is related to the feedback signal FB (when the light emitting device driver circuit 200 is stable in the enable phase, the level of the feedback signal FB is approximately equal to the first reference voltage VREF_b) and because it takes very short time for the level of the feedback signal FB to be raised up from the second reference voltage VREF_a to the first reference voltage VREF_b, the load current generation circuit 14 can determine the first current level Ip according to the voltage of the load node NLD (i.e., the level of the feedback signal FB) within a short time, whereby the load current iLOAD can be rapidly raised to the first current level Ip during the predetermined current elevation period Tr. From one perspective, the relationship between the second reference voltage VREF_a and the first reference voltage VREF_b (i.e., a difference therebetween) can be properly set, so that after the light emitting device driver circuit 200 transits to the enable phase, the light emitting device driver circuit 200 can hold the sample voltage by the sample-and-hold circuit 15, whereby within the predetermined current elevation period Tr following the transition time point Ts, the difference between the first reference voltage VREF_b and the feedback signal FB is smaller than a predetermined voltage difference, so that the load current generation circuit 14 can determine the first current level Ip during the predetermined current elevation period Tr.

Figure 7A:
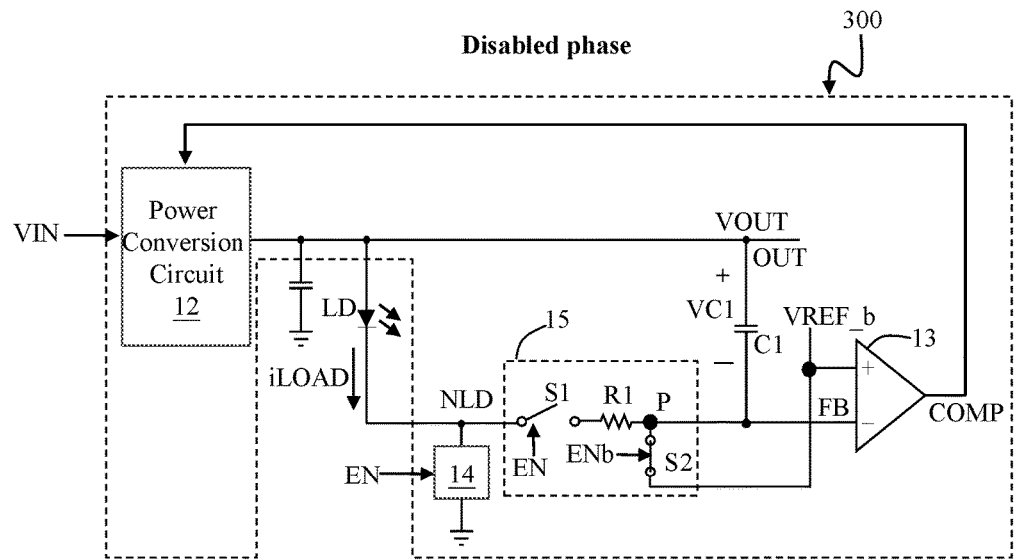
FIG. 7A shows another specific embodiment of a light emitting device driver circuit according to the present invention under a disable phase.
Figure 7B:
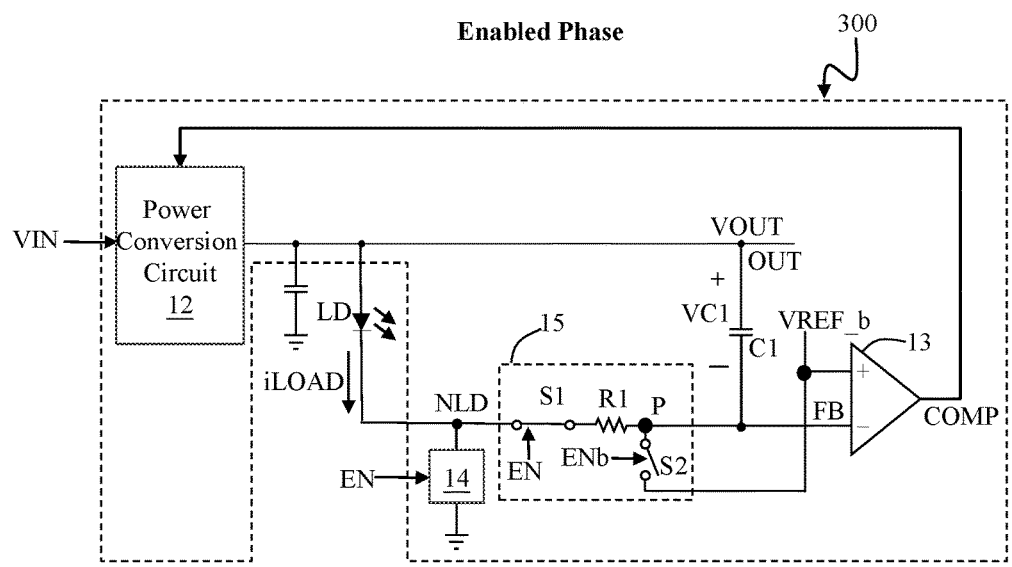
FIG. 7B shows another specific embodiment of a light emitting device driver circuit according to the present invention under an enable phase.
Figure 8:
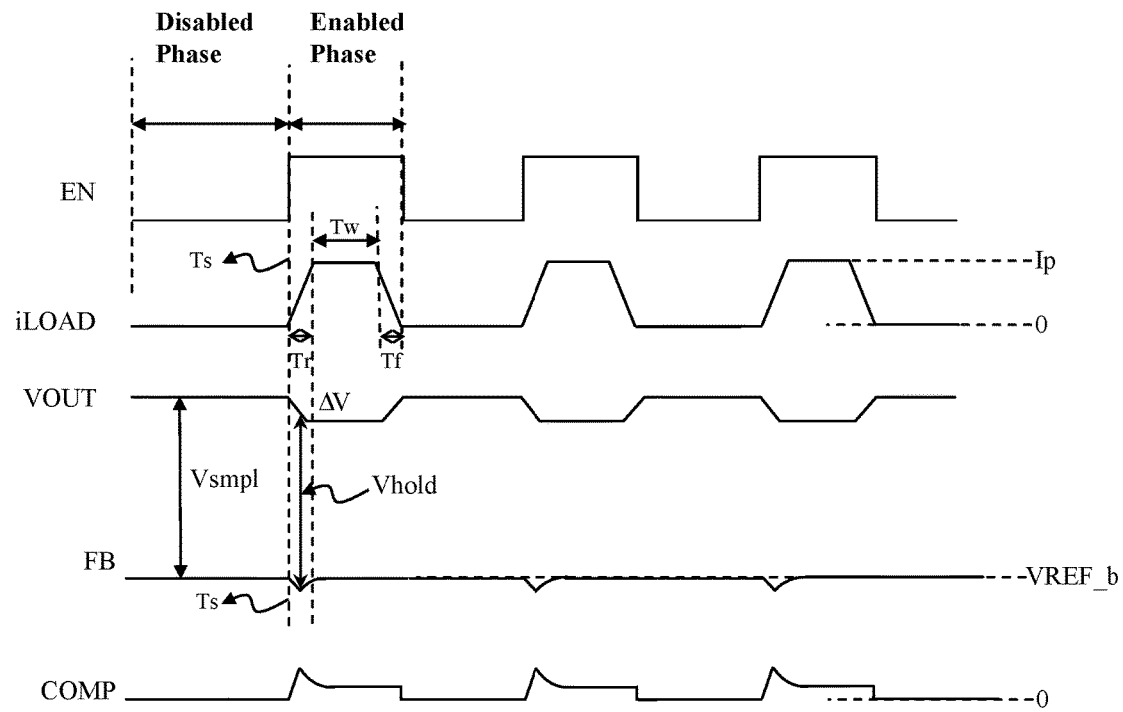
FIG. 8, corresponding to FIGS. 7A-7B, shows waveforms of operation signals of a light emitting device driver circuit according to the present invention.

Please refer to FIG. 7A, FIG. 7B and FIG. 8. FIG. 7A shows another specific embodiment of a light emitting device driver circuit according to the present invention under a disable phase. FIG. 7B shows another specific embodiment of a light emitting device driver circuit according to the present invention under an enable phase. FIG. 8, corresponding to FIGS. 7A-7B, shows waveforms of operation signals of a light emitting device driver circuit according to the present invention.

The light emitting device driver circuit 300 shown in FIG. 7A and FIG. 7B operates in a similar way as the light emitting device driver circuit 200 shown in FIG. 5A and FIG. 5B t, but is different in that: in this embodiment shown in FIG. 7A and FIG. 7B, the level of the second reference voltage VREF_a is equal to the level of the first reference voltage VREF_b. In this embodiment (the light emitting device driver circuit 300 shown in FIG. 7A and FIG. 7B), the second reference voltage VREF_a can be, for example but not limited to, directly coupled to the first reference voltage VREF_b.

Accordingly, as shown in FIG. 7A, in one embodiment, when the light emitting device driver circuit 300 operates in the disable phase, the first switch S1 is controlled by the enable signal EN to be non-conductive, whereas the second switch S2 is controlled by a complementary enable signal ENb to be conductive, whereby the sample-and-hold circuit 15 connects the feedback signal FB with the first reference voltage VREF_b, and the sample-and-hold circuit 15 disconnects the feedback signal FB from the load node NLD. Accordingly, at a transition time point Ts where a transition takes place from the disable phase to the enable phase (referring to the waveform of the enable signal EN as shown in FIG. 8), the feed-forward capacitor C1 samples a sample voltage Vsmp1 (referring to the waveform of the output voltage VOUT and the feedback signal FB as shown in FIG. 8). Note that the "sample voltage Vsmp1" refers to a voltage level VC1 across the feed-forward capacitor C1 in the disable phase.

As shown in FIG. 7B, in one embodiment, when the light emitting device driver circuit 300 operates in the enable phase, the first switch S1 is controlled by the enable signal EN to be conductive, whereas the second switch S2 is controlled by the complementary enable signal ENb to be non-conductive, whereby the sample-and-hold circuit 15 disconnects the feedback signal FB from the first reference voltage VREF_b, and the sample-and-hold circuit 15 connects the feedback signal FB with the load node NLD.

Accordingly, when the light emitting device driver circuit 300 operates in the enable phase, the feed-forward capacitor C1 holds the sample voltage Vsmp1 (as shown in FIG. 8, Vhold is approximately equal to Vsmp1), so that during a predetermined current elevation period Tr following the transition time point Ts (referring to the waveform of the feedback signal FB as shown in FIG. 8), there is a large difference between the first reference voltage VREF_b and the feedback signal FB, and thus the load current iLOAD can be rapidly raised to the first current level Ip during the predetermined current elevation period Tr.

In comparison to the prior art, in the embodiment of the light emitting device driver circuit 300, the load current iLOAD can be rapidly raised to the first current level Ip during the predetermined current elevation period Tr. The advantage of the present invention over the prior art and is illustrated in FIG. 6 and FIG. 8: the present invention is capable of improving the load-transient response of the light emitting device driver circuit 300, so that the load current iLOAD is rapidly raised to the desired current level Ip during the predetermined current elevation period Tr.

In this and the previous embodiments, when the light emitting device driver circuit 200 or 300 operates in the disable phase (i.e., when the enable signal EN is at its low level), because the sample-and-hold circuit 15 connects the feedback signal FB to the second reference voltage VREF_a which is smaller than (in the embodiment of FIG. 6) or equal to (in the embodiment of FIG. 8) the level of the first reference voltage VREF_b, as compared to the prior art wherein the feedback signal FB is at a high level (for example but not limited to 1.6V), in the disable phase, the feedback signal FB of the present invention is coupled to a level which is only slightly smaller than or equal to a desired value in the enable phase (such as the first reference voltage VREF_b). Thus, when the light emitting device driver circuit 200 or 300 transits from a disable phase to an enable phase (i.e., when the enable signal EN transits from a low level to a high level) at a transition time point Ts, the feedback signal FB does not have to fall down from a very high voltage level to a very low level. Consequently, the response time can be effectively shortened, to speed up the current elevation speed.

In addition, the output voltage VOUT decreases as the load current iLOAD increases; however, during the predetermined current elevation period Tr following the transition time point Ts (referring to the left part of the waveform of the predetermined current elevation period Tr as shown in FIG. 6 and FIG. 8), by the sample-and-hold function provided by the feed-forward capacitor C1 (i.e., as shown by Vsmp1 and Vhold in FIG. 6 and FIG. 8), the voltage VC1 across the feed-forward capacitor C1 remains the same as the voltage Vhold (which is approximately equal to Vsmp1 which is sampled at the transition time point Ts), so the level of the feedback signal FB also falls down along with the decrease of the output voltage Vout, from the level of the second reference voltage VREF_a to a voltage level which is slightly lower than the level of the second reference voltage VREF_a (and which is lower than the level of the first reference voltage VREF_b). Hence, the corresponding error amplification signal COMP can respond rapidly to transit state (e.g., as shown in FIG. 6, the error amplification signal COMP changes from its original high voltage level to a low level), whereby the power conversion circuit 12 can respond rapidly to properly supply the load current iLOAD.

As a result, the load current iLOAD is rapidly raised to the first current level Ip during the predetermined current elevation period Tr.

Figure 10A:
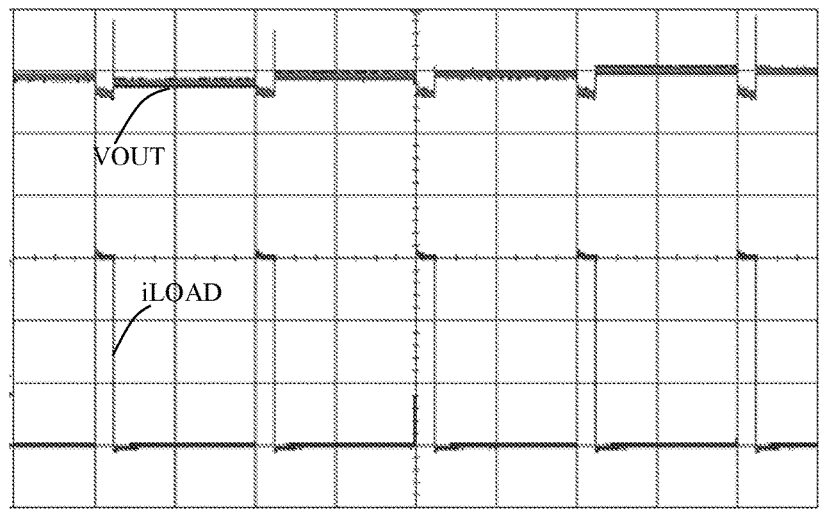
FIGS. 10A-10B show measured waveforms which demonstrate how a light emitting device driver circuit of the present invention improves load-transient response.
Figure 10B:
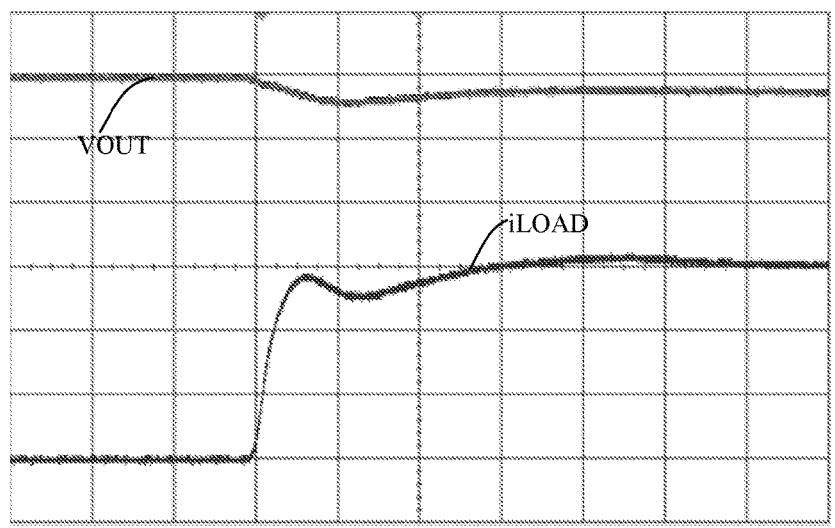

Please refer to FIGS. 10A-10B, which show measured waveforms to demonstrate how a light emitting device driver circuit of the present invention improves load-transient response. As shown in FIG. 10A, according to the present invention, the load current iLOAD of the light emitting device driver circuit can be rapidly raised to the first current level Ip during the predetermined current elevation period Tr. FIG. 10B is an enlarged view of FIG. 10A; FIG. 10B shows more clearly that the load current iLOAD of the light emitting device driver circuit 200 of the present invention can be rapidly raised to the first current level Ip during the predetermined current elevation period Tr.

The present invention has been described in considerable detail with reference to certain preferred embodiments thereof. It should be understood that the description is for illustrative purpose, not for limiting the scope of the present invention. An embodiment or a claim of the present invention does not need to achieve all the objectives or advantages of the present invention. The title and abstract are provided for assisting searches but not for limiting the scope of the present invention. Those skilled in this art can readily conceive variations and modifications within the spirit of the present invention. For example, a device which does not substantially influence the primary function of a signal can be inserted between two devices or circuits shown to be indirect connection in the embodiments, such as a switch or a resistor. For another example, in the embodiments mentioned above, the first switch S1 is controlled by the enable signal EN while the second switch S2 is controlled by a complementary enable signal ENb, but this is only for illustration, not for limiting the scope of the present invention. When the first switch S1 and the second switch S2 are different types of transistors, the first switch S1 and the second switch S2 can be both controlled by the same enable signal EN. It is not limited for each of the embodiments described herein before to be used alone; in the spirit of the present invention, two or more of the embodiments described hereinbefore can be used in combination. For example, two or more of the embodiments can be used together, or, a part of one embodiment can be used to replace a corresponding part of another embodiment. In view of the foregoing, the spirit of the present invention should cover all such and other modifications and variations, which should be interpreted to fall within the scope of the following claims and their equivalents.

What is claimed is:

1. A light emitting device driver circuit, which is configured to operably supply a load current to a light emitting device so as to drive the light emitting device; the light emitting device driver circuit comprising:

a power conversion circuit, which is configured to operably convert an input voltage to an output voltage at an output terminal according to an error amplification signal and supply the load current to the light emitting device, wherein the light emitting device is coupled between the output terminal and a load node;

an error amplifier circuit, which is configured to operably generate the error amplification signal according to a difference between a first reference voltage and a feedback signal;

a sample-and-hold circuit, which is coupled between a terminal of the error amplifier circuit which receives the feedback signal and the load node;

a load current generation circuit, wherein the load current generation circuit, the sample-and-hold circuit and the light emitting device are commonly coupled to the load node, the load current generation circuit being configured to operably determine a first current level of the load current during an enable phase and the load current generation circuit being configured to operably determine a second current level of the load current during a disable phase; and a feed-forward capacitor, which is coupled between the output terminal and the terminal of the error amplifier circuit which receives the feedback signal;

wherein, when the light emitting device driver circuit operates in the disable phase, the sample-and-hold circuit connects the feedback signal with a second reference voltage, whereas the sample-and-hold circuit disconnects the feedback signal from the load node, whereby at a transition time point when a transition takes place from the disable phase to the enable phase, the feed-forward capacitor samples a sample voltage;

wherein, when the light emitting device driver circuit operates in the enable phase, the sample-and-hold circuit disconnects the feedback signal from the second reference voltage, whereas the sample-and-hold circuit connects the feedback signal with the load node, whereby the feed-forward capacitor holds the sample voltage, so that during a predetermined current elevation period following the transition time point, there is a difference between the first reference voltage and the feedback signal, and the difference is large enough to cause the load current to be raised to the first current level within the predetermined current elevation period.

2. The light emitting device driver circuit of claim 1, wherein a level of the second reference voltage is smaller than a level of the first reference voltage.

3. The light emitting device driver circuit of claim 1, wherein a level of the second reference voltage is equal to a level of the first reference voltage.

4. The light emitting device driver circuit of claim 1, wherein in the enable phase, the load current generation circuit determines the first current level according to a voltage of the load node.

5. The light emitting device driver circuit of claim 4, wherein the first current level is related to the first reference voltage.

6. The light emitting device driver circuit of claim 4, wherein the load current generation circuit includes a voltage-controlled current source, which is configured to operably regulate the load current according to the voltage of the load node.

7. The light emitting device driver circuit of claim 1, wherein the sample-and-hold circuit includes:
    a resistor;
    a first switch, which is coupled in series to the resistor between the load node and the feedback signal; and
    a second switch, which is coupled between the feedback signal and the second reference voltage;
    wherein, when the light emitting device driver circuit operates in the disable phase, the first switch is controlled to be non-conductive, whereas the second switch is controlled to be conductive, whereby the feedback signal is electrically connected with the second reference voltage and the feedback signal is disconnected from the load node; and
    wherein, when the light emitting device driver circuit operates in the enable phase, the first switch is controlled to be conductive, whereas the second switch is controlled to be non-conductive, whereby the feedback signal is disconnected from the second reference voltage and the feedback signal is electrically connected with the load node.

8. The light emitting device driver circuit of claim 1, wherein when the light emitting device driver circuit operates in the enable phase, the feed-forward capacitor provides a feed-forward function, whereby the light emitting device driver circuit operates under a steady state and a bandwidth of the light emitting device driver circuit is higher than a predetermined bandwidth.

9. The light emitting device driver circuit of claim 7, wherein the predetermined current elevation period is related to a product of a resistance of the resistor multiplied by a capacitance of the feed-forward capacitor.

10. The light emitting device driver circuit of claim 1, wherein the predetermined current elevation period is smaller than one microsecond (1 µs).

11. The light emitting device driver circuit of claim 1, wherein the power conversion circuit includes a low dropout regulator or a switching regulator.

12. The light emitting device driver circuit of claim 1, wherein the second current level is zero.

13. The light emitting device driver circuit of claim 1, wherein the difference between the first reference voltage and the feedback signal during the predetermined current elevation period is smaller than a predetermined voltage difference.

* * * * *